(12) United States Patent
Ogatsu

(10) Patent No.: US 7,202,422 B2
(45) Date of Patent: Apr. 10, 2007

(54) ELECTROMAGNETICALLY SHIELDED CIRCUIT DEVICE AND SHIELDING METHOD THEREFOR

(75) Inventor: Toshinobu Ogatsu, Tokyo (JP)

(73) Assignee: NEC Corporation, Minato-Ku, Tokyo (JP)

( * ) Notice: Subject to any disclaimer, the term of this patent is extended or adjusted under 35 U.S.C. 154(b) by 247 days.

(21) Appl. No.: 10/511,994

(22) PCT Filed: Apr. 23, 2003

(86) PCT No.: PCT/JP03/05136

§ 371 (c)(1),
(2), (4) Date: Oct. 21, 2004

(87) PCT Pub. No.: WO03/092347

PCT Pub. Date: Nov. 6, 2003

(65) Prior Publication Data
US 2005/0162841 A1    Jul. 28, 2005

(30) Foreign Application Priority Data
Apr. 23, 2002    (JP) ............... 2002-120828

(51) Int. Cl.
  *H05K 9/00*    (2006.01)
(52) U.S. Cl. .............. 174/373; 174/377; 361/816
(58) Field of Classification Search ........... 174/377, 174/378, 382, 373; 361/816, 818, 800
See application file for complete search history.

(56) References Cited

U.S. PATENT DOCUMENTS

| | | |
|---|---|---|
| 4,858,075 A | 8/1989 | Butterworth |
| 5,005,106 A | 4/1991 | Kiku |
| 5,557,064 A * | 9/1996 | Isern-Flecha et al. ....... 174/393 |
| 2002/0129951 A1 | 9/2002 | Babb et al. |

FOREIGN PATENT DOCUMENTS

| | | |
|---|---|---|
| EP | 0 802 710 A2 | 10/1997 |
| GB | 2 254 193 A | 9/1992 |
| JP | 2-45699 | 3/1990 |
| JP | 4-58596 | 2/1992 |
| JP | 4-72698 | 3/1992 |
| JP | 09-051192 | 2/1997 |
| JP | 2000-223647 A | 8/2000 |
| JP | 2000-251463 A | 9/2000 |
| WO | WO 95/28072 | 10/1995 |
| WO | WO 95/28822 | 10/1995 |

OTHER PUBLICATIONS abstract for JP 2000223647, published Aug. 11, 2000.*
abstract for JP4-58596, published Feb. 25, 1992.*

* cited by examiner

*Primary Examiner*—Hung V. Ngo
(74) *Attorney, Agent, or Firm*—Muirhead & Saturnelli, LLC

(57) ABSTRACT

In a method of shielding a circuit device, a circuit board on which an electronic component has mounted and which has a ground connection portion is provided. An entire portion of the circuit board is inserted into a shield pack having a sack shape. The shield pack has an insulating layer as an innermost layer and an electric conductive layer as an outermost layer. The insulating layer of the shield pack is contacted with the electronic component and the circuit board. The ground connection portion of the circuit board is connected to the electric conducive layer of the shield pack.

20 Claims, 7 Drawing Sheets

VACUUM SUCTION

VACUUM SUCTION

ELECTROMAGNETICALLY SHIELDED CIRCUIT DEVICE AND SHIELDING METHOD THEREFOR

TECHNICAL FIELD

The present invention relates to a circuit device which has been electromagnetically shielded, and a shielding method for shielding the circuit device.

BACKGROUND ART

Electronic components such as semiconductor components, and functional groups such as to analog circuits and wireless circuits have been mounted on a printed circuit board. In case that a printed circuit board is electromagnetically shielded, either the electronic component or the functional group to be electromagnetically shielded is covered by a case made of metal, and the metal case is electrically connected to a ground terminal of the printed circuit board by way of solder. Instead of the metal case, there is a case that a cover made of resin and having an inner plated metal layer may be employed. Furthermore, instead of the metal case and the resin case, there is another case that an electromagnetic wave absorbing sheet capable of weakening electromagnetic waves may be employed.

However, in the conventional electromagnetic shielding methods by way of the metal case and the resin cover, it is necessary to ensure a large area where a metal case component or a resin cover component is in contact to the printed circuit board. As a result, the large contact area may largely impede mounting of the electronic components in high density. Also it is required to avoid that an electronic component and a semiconductor component are in contact to the metal case or the resin cover. For this reason, when the electromagnetic shield is carried out, the height of a device becomes high.

Further, in the method of using the electromagnetic wave absorbing sheet, the electromagnetic shielding effect is small. In addition, this method cannot solve electromagnetic interference among the respective electronic components, but also cannot reinforce the printed circuit board.

In conjunction with the above description, an electromagnetic shielding method is disclosed in Japanese Laid Open Utility Model Application (JU-A-Heisei 2-45699). In this conventional example, insulating films are formed on surfaces of a circuit board on which electronic components are mounted. Subsequently, an electric conductive shield films are formed on the insulating films. Thereafter, the electric conductive shield films are connected to an earth line formed on the electronic circuit board.

Also, another electromagnetic shielding method is disclosed in Japanese Laid Open patent Application (JP-A-Heisei 4-58596). In this conventional example, electronic circuit components on the printed circuit board is partitioned by electric conductors which are connected to a ground portion of the printed circuit board to prevent mutual electromagnetic inference between the electronic circuit components. Subsequently, the printed circuit board and the entire of electronic circuit components mounted on this printed-wiring board are covered by an insulating sealing resin or an insulating thin-film seal, which can be easily peeled later. Subsequently, a portion of the electric conductor is exposed from the sealing resin or the thin-film seal. Next, a metal plating layer or an electric conductive paint layer is coated on the sealing resin or the thin-film seal in such a manner that the metal plating layer or the electric conductive paint layer is connectable to the electric conductor.

Also, a shielding device is disclosed in Japanese Laid Open Patent Application (JP-A-Heisei 4-72698). In this conventional example, a portion of a printed circuit board where electronic components are mounted is covered by a bag made of thermal shrinkage resin. An electric conductive film has been formed on the outer surface of this bag. A ground pattern formed on an exposed portion of the printed circuit board is connected to the electric conductive film by a lead wire.

Also, a method of manufacturing a high frequency module is disclosed in Japanese Laid Open Patent Application (JP-P2000-223647A). In the high frequency module manufacturing method of this conventional example, a printed circuit board is provided on which electronic components have been mounted and a ground terminal having a predetermined height has been formed. One surface side of the printed circuit board on which electronic components have been mounted is covered by a stacked sheet in which an insulating resin film and an electric conductive film having the shield effect are laminated. The printed circuit board is heated so as to soften the insulating resin film, so that the ground terminal and the electric conductive film are electrically connected.

Also, a memory module is disclosed in Japanese Laid Open Patent Application (JP-P2000-251463A). In the memory module of this conventional example, a memory chip is mounted on a portion of one surface of a printed circuit board. This portion of one surface of the printed circuit board is covered by a shield sheet formed by stacking an adhesive sheet and an aluminum sheet. Thus, the shield sheet is adhered on the upper surface of the memory chip and the upper surface of the printed circuit board so that the semiconductor memory chip is electromagnetically shielded and is fixed on the printed circuit board. As a result, electromagnetic noise radiated from the memory chip is shield by the aluminum sheet. Also, since the memory chip is fixed by the adhesive sheet, the occurrence of a connection failure caused through vibration may also be suppressed. Furthermore, the aluminum sheet functions as a heat radiating plate, so that the heat radiation of the memory module may be improved.

DISCLOSURE OF INVENTION

Therefore, an object of the present invention is to provide an elelctromagnetically shielded circuit device in which electromagnetic shield can be accomplished simply and surely without preventing high density integration of electronic components and a printed circuit board can be reinforced, and a shielding method of the circuit device.

In an aspect of the present invention, a method of shielding a circuit device, includes (a) providing a circuit board on which an electronic component has mounted and which has a ground connection portion; (b) inserting an entire portion of the circuit board into a shield pack having a sack shape, the shield pack having an insulating layer as an innermost layer and an electric conductive layer as an outermost layer; and (c) contacting the insulating layer of the shield pack with the electronic component and the circuit board. The ground connection portion of the circuit board is connected to the electric conducive layer of the shield pack.

Here, the (c) contacting step may include (d) reducing an internal capacity of the shield pack.

At this time, the circuit board may further include a ground connection terminal connected to the ground connection portion. The ground connection terminal breaks through the shield pack to be connected with the electric conducive layer during the (c) contacting step. The ground connection terminal may include a tip portion having a conical shape; and a base portion connected to the tip portion. It is desirable that the base portion has a sectional area which is smaller than a bottom plane of the cone such that the base portion does not project from the bottom plane of the cone. Also, the base portion of the ground connection terminal may have a height which is substantially equal to a thickness of the shield pack. It is desirable that the bottom plane of the cone is connected to the electric conductive layer when the tip portion breaks through the shield pack.

Also, the ground connection portion and the electric conductive layer may be connected by passing an electric conductive connection component through the ground connection portion between the shield pack and the circuit board, after the insulating layer of the shield pack is fit with the electronic component and the circuit board. The circuit board may have a through-hole formed in the ground connection portion, and the through-hole is filled with an electric conductor connected to the ground connection portion. It is desirable that the connection component passes through the through-hole to connect the ground connection portion with the electric conductive layer. It is desirable that the connection component is used to fix the circuit board contained within the shield pack to a housing, when the housing has an electric conductive portion connected to the electric conductive layer.

Also, the (d) reducing step may include vacuum-sucking air contained in the shield pack such that the insulating layer of the shield pack contacts the electronic component and the circuit board. In this case, the (d) reducing step may include vacuum-sucking air contained in the shield pack such that the insulating layer of the shield pack contacts the electronic component and the circuit board. At this time, it is further desirable that an adhesive agent may be coated on at least a portion of the circuit board and at least a portion of an outer surface of the electronic component.

When the shield pack is made of thermal shrinkage material, the (d) reducing step may include heating the shield pack such that the insulating layer of the shield pack contacts the electronic component and the circuit board.

Also, in another aspect of the present invention, an electromagnetically shielded circuit device includes a circuit board on which an electronic component has been mounted and which has a ground connection portion; a sack shaped shield pack which covers an entire portion of the circuit board, the shield pack having an insulating layer as an innermost layer and an electric conductive layer as an outermost layer; and an electric conductive connection component which passes through the shield pack to the circuit board to connect the ground connection portion to the electric conductor layer of the shield pack.

Here, the connection component may be a ground connection terminal which is previously fixedly provided to the ground connection portion of the circuit board. It is desirable that the ground connection terminal has a tip portion having a conical shape and a base portion connected to the tip portion, and the base portion has a sectional area which is smaller than a bottom plane of the cone such that the base portion does not project from the bottom plane of the cone. It is desirable that the base portion of the ground connection terminal has a height which is substantially equal to a thickness of the shield pack, and the bottom plane of the cone is connected to the electric conductive layer under in a state that the tip portion breaks through the shield pack.

Also, It is desirable that the circuit board has a through-hole formed in the ground connection portion, the through-hole is filled with an electric conductor connected to the ground connection portion, and the connection component passes through the through-hole to connect the ground connection portion with the electric conductive layer.

In this case, it is desirable that the connection component is a via and is used to fix the circuit board contained within the shield pack to a housing, and the housing has an electric conductive portion connected to the electric conductive layer.

BEST MODE FOR CARRYING OUT THE INVENTION

Hereinafter, a circuit device and an electromagnetic shielding method of the present invention will be described in detail with reference to the attached drawings.

Figure 1:
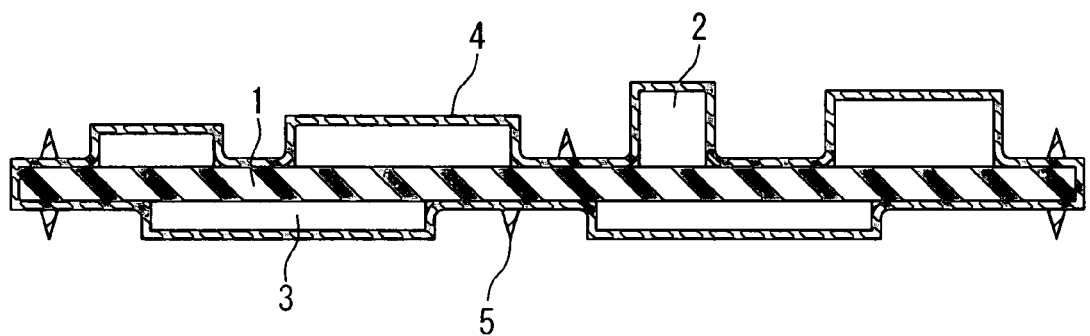
FIG. 1 is a cross sectional view showing the structure of a circuit device according to a first embodiment mode of the present invention.
Figure 2:
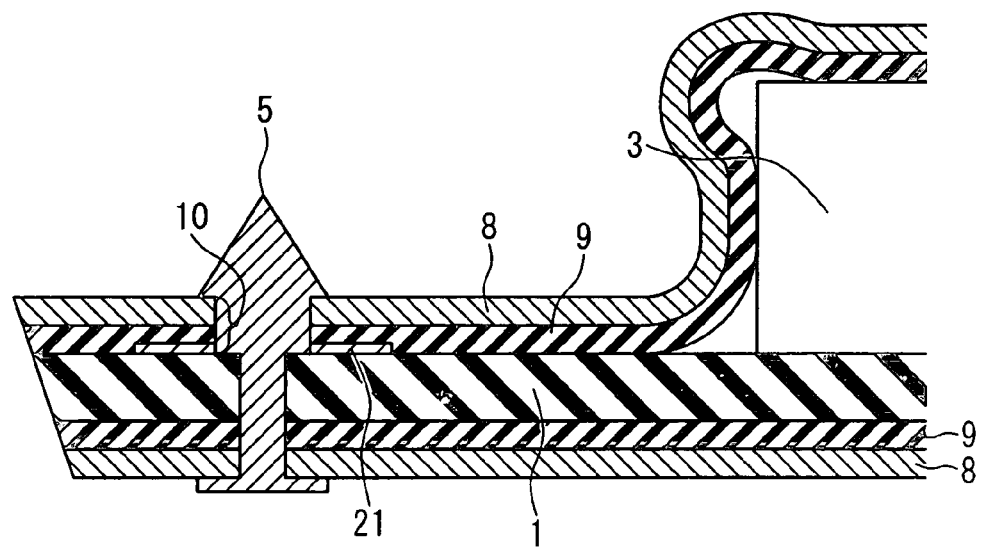
FIG. 2 is an enlarged view showing a ground connection terminal shown in FIG. 1.
Figure 3:
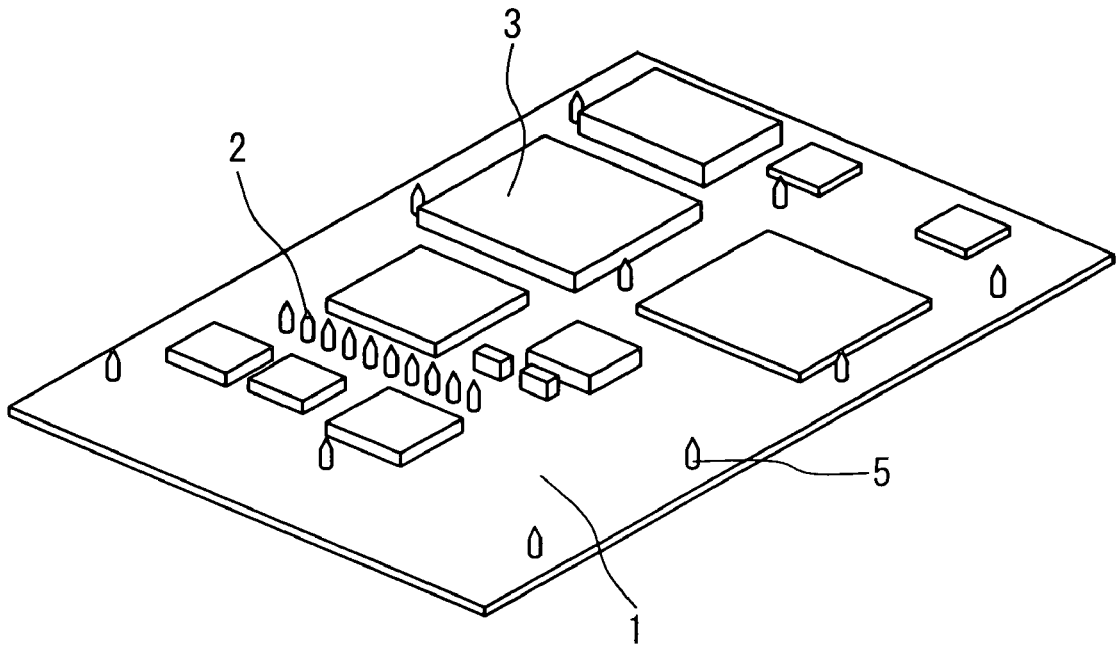
FIG. 3 is a perspective view showing a printed circuit board on which electronic components shown in FIG. 1 have been mounted.
Figure 4:
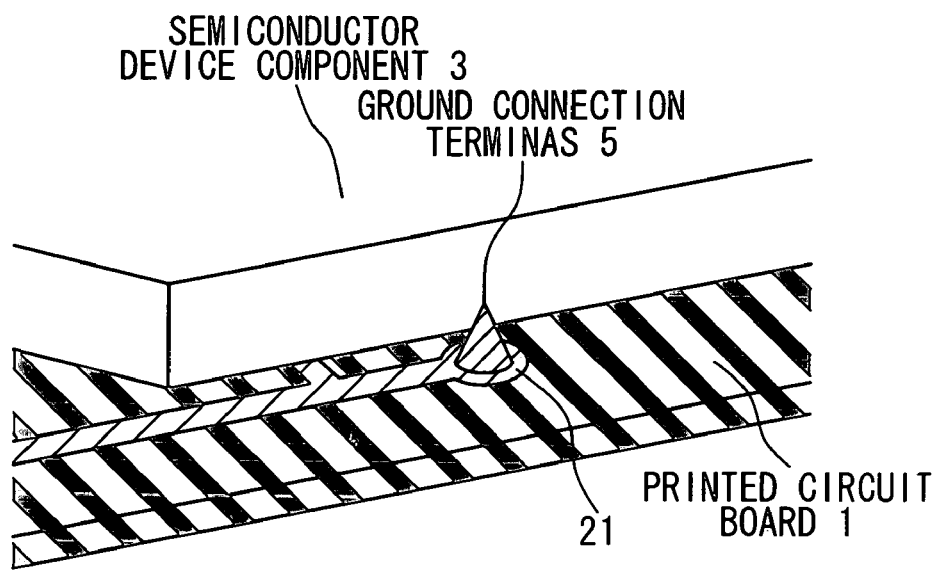
FIG. 4 is an enlarged view showing the ground connection terminal shown in FIG. 3.

FIG. 1 is a sectional view showing the structure of a circuit device according to the first embodiment of the present invention. FIG. 2 is an enlarged view showing a ground connection terminal portion shown in FIG. 1. FIG. 3 is a perspective view showing the structure of a printed circuit board on which electronic components shown in FIG. 1 have been mounted. FIG. 4 is an enlarged view showing a ground connection terminal shown in FIG. 3.

Referring to FIG. 1, the circuit device according to the first embodiment of the present invention is composed of a printed circuit board or a circuit board 1 as a major wiring board of a portable appliance which is strongly required to be made compact and slim. Mount components 2 such as an SMT (Surface Mount Technology) type electronic component, and semiconductor device components 3 such as an IC have been mounted on the printed circuit board 1 by way of a surface mounting system. Also, ground connection terminals 5 are arranged on the printed circuit board 1 and provided on a ground connection pattern portion 21. The entire of the printed circuit board 1 on which electronic components such as the mount components 2 and the semiconductor device components 3 had been mounted is stored in a shield pack 4 and shielded. The ground connection terminals 5 penetrate through the shield pack 4.

Referring now to FIG. 2, the shield pack 4 has a multi-layer structure formed of an insulating layer 9 as the innermost layer and a metal layer 8 as the outermost layer. In case the multi-layer structure has two layers, the insulating layer 9 is formed on the inner side and the metal layer 8 is formed on the outer side, as shown in FIG. 2. The insulating film 9 is formed of a thermosetting resin material such as a thermosetting resin film. The insulating layer 9 is hardened such that this insulating layer 9 is in close contact with the surfaces of the mount components 2, semiconductor device components 3, and printed circuit board 1. The metal film 8 is formed by vapor-depositing a metal on the insulating layer 9. It is desirable that the metal layer 8 has been previously formed on the insulating layer 9. Instead, the metal layer 8 may be formed after the ground connection terminals 5 have broken through the shield pack 4. The metal layer 8 is in contact to the ground connection terminals 5 penetrate through the shield pack 4, and are connected with the ground portion of the printed circuit board 1. At this time, in order to more firmly connect the metal layer 8 to the ground portion, the ground connection terminal 5 and the metal layer 8 may be soldered after the ground connection terminals 5 penetrate through the shield pack 4.

As shown in FIGS. 1 to 4, the ground connection terminal 5 has a tip portion having a conical shape, and a base portion, and is previously planted in the printed circuit board on which the electronic components have been mounted. The base portion may be inserted to a half way of the printed circuit board 1 (not shown), or may be passed through the printed circuit board, as shown in FIG. 2.

The tip portion of the ground connection terminal 5 breaks through the shield pack 4, and is connected to the metal layer 8. The base portion of the ground connection terminal 5 has a step portion 10 having a height substantially equal to a thickness of the shield pack 4. The step portion 10 is formed in such a manner that the shield pack 4 cannot be easily extracted when the ground connection terminal 5 breaks through the shield pack 4. Also, the ground connection terminal 5 is made of electric conductive material characteristic such as metal, and is connected to the ground connection portion 21 of the printed circuit board 1. The ground connection terminal 5 functions as an electrode for electrically connecting the metal layer 8 of the shield pack 4 to the ground portion of the printed circuit board 1. It should be noted that a sectional area of the step portion 21 of the ground connection terminal 5 is preferably smaller than an area of a bottom plane of the tip portion so as not to project from the base plane.

Next, a shielding method of the circuit device according to this embodiment mode will now be described in detail with reference to FIGS. 5A to 5D and FIG. 6.

FIGS. 5A to 5D are step diagrams showing the shielding method of the circuit device according to the present invention. FIG. 6 is a sectional view showing an example in which the external connection terminals are mounted on the circuit device according to this embodiment of the present invention.

Figure 5A:
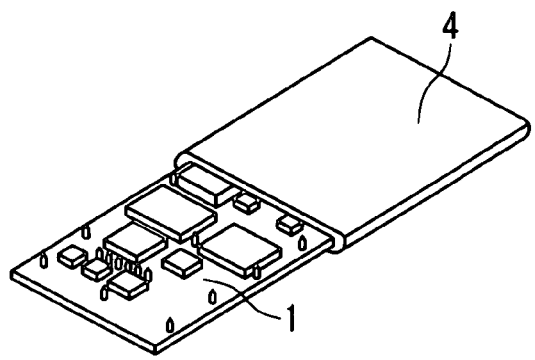
FIGS. 5A to 5D are diagrams showing a shielding method of the circuit device according to the first embodiment mode of the present invention.
Figure 5B:
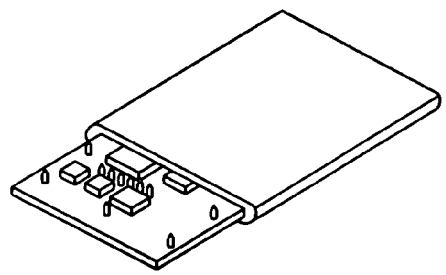
Figure 5C:
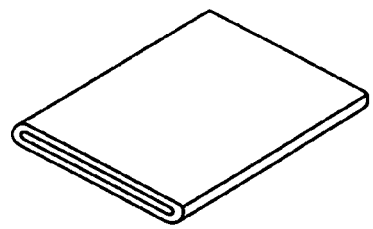
Figure 5D:
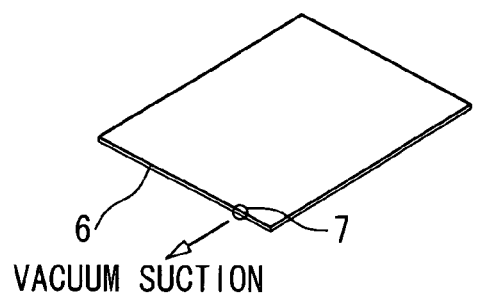
Figure 6:
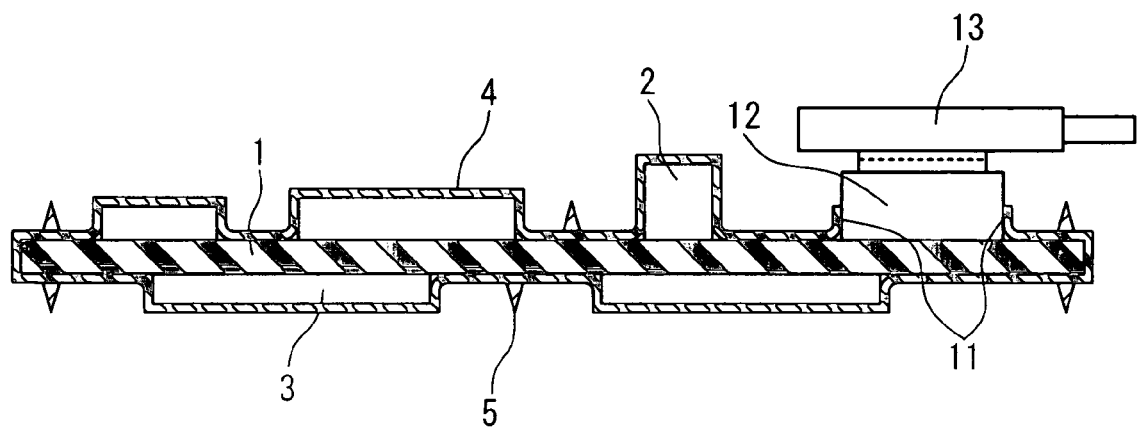
FIG. 6 is a cross sectional view showing an example in which an external connection terminal is mounted on the circuit device according to a modification of the first embodiment mode of the present invention.

As shown in FIGS. 5A to 5C, an entire of the printed circuit board 1 on which the electronic components have been mounted is inserted into the shield back 4 having a sack shape. Subsequently, as shown in FIG. 5D, a joint portion 6 of an opening portion of the shield pack 4 is adhered mainly to each other, and vacuum suction is carried out from a remaining opening portion 7 thereof. As a result, an inner capacity of the shield pack 4 is reduced, and the shield pack 4 is made closely contact to the surface of the printed circuit board 1 and the surfaces of the mount components.

The shield pack 4 having the sack shape has the insulating layer 9 on the inner side thereof, namely, on the side when the shield pack 4 contacts the printed circuit board 1, and also has the metal layer 8 on the outer side thereof, namely, on the side where the shield pack 4 does not contact the printed circuit board 1. Since the vacuum suction is carried out, the insulating layer 9 is made contact the mount components 2 and the semiconductor components 3, which have been mounted on the printed circuit board 1, along these mount components 2 and semiconductor components 3. It should be understood that there is no a problem that the electrodes and are electrically short-circuited, since the insulating layer 9 which contact the mount component 2 and the semiconductor component 3 may play a role of electric insulation, even when the shield pack 4 is in contact with electrodes, the mount components 2 and the semiconductor device components 3.

Also, a portion of the shield pack 4 opposes to the ground connection terminal 5, which is planted on the printed circuit board 1, and is flawed by the tip portion of the ground connection terminal 5 to form a hole in the vacuum suction. As a result, as shown in FIG. 2, the ground connection terminal 5 penetrates through the shield pack 4, and contacts the metal layer 8 of the shield pack 4. Thus, the electromagnetic shield is achieved by the insulating layer 9 and the metal layer 8 of the shield pack 4.

Next, in a state that the shield pack 4 is fit with the printed circuit board 1 on which the electronic components have been mounted, a heating operation is carried out, so that the shield pack 4 is hardened. It should be understood that since the shield pack 4 is put between the mount components 2 and the semiconductor components 3, the shield pack 4 is thermally hardened in such a manner that the strength of the entire printed circuit board 1 is reinforced, and an occurrence of a defect can be prevented at a component joint portion when a shock is applied to the shield pack 4.

As shown in FIG. 6, after the shield pack 4 is thermally hardened, a specific portion 11 of the shield pack 4 which is required to be externally connected to a connector may be cut away. As a result, a connector component 12 is exposed, so that an external connection terminal 13 can be mounted. A mechanical treatment such as cutting may be carried out every printed circuit board 1 within the shield pack 4.

As previously described, in accordance with this embodiment, the effective electromagnetic shield can be formed only by fitting the shield pack 4 of the insulating layer 9 and the metal layer 8 to the printed circuit board 1 on which the electronic components have been mounted. As a consequence, the electromagnetic shield can be accomplished within the minimum space in the simple and firm manner without hindering the high density mounting of the electronic components. Also, the printed circuit board 1 can be reinforced at the same time as the shield pack 4 is hardened in the state that it is in close contact to the printed circuit board 1.

Moreover, in accordance with this embodiment, the shield pack 4 can be simply peeled even when any problem occurs in the printed circuit board 1 after the electromagnetic shield has been accomplished, and even when a part or entire of the printed circuit board 1 should be exposed in order to check and repair the electronic components. Also, this feature may avoid mischief since the shield pack 4 which has been once dismounted cannot be again mounted.

Figure 7A:
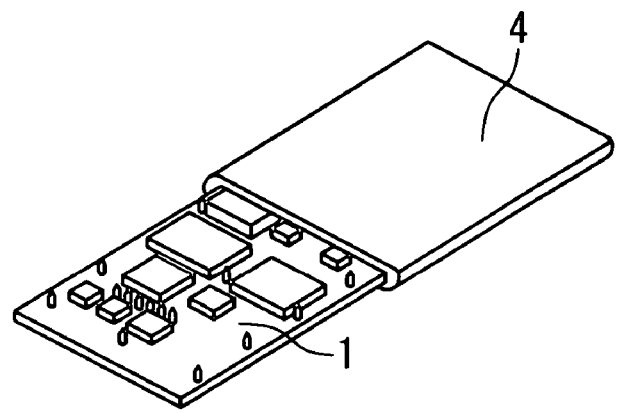
FIG. 7A to FIG. 7C are diagrams showing a shielding method when a thermal shrinkage resin pack is employed as a shielding pack in the circuit device according to a second embodiment mode of the present invention.
Figure 7B:
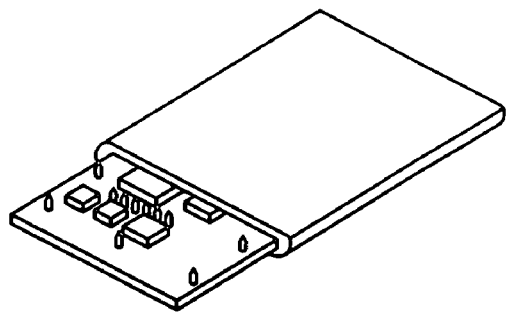
Figure 7C:
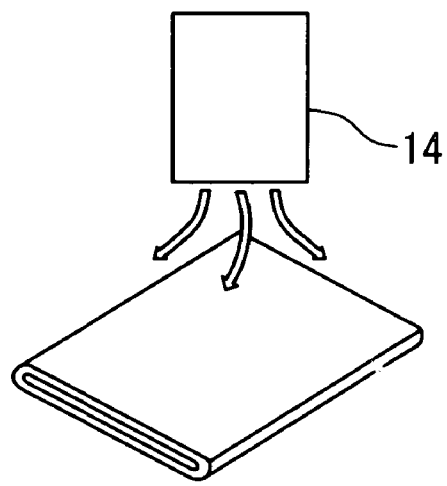

FIG. 7A to FIG. 7C are manufacturing step diagrams showing a shielding method when a thermal shrinkage resin material is used for a shield pack in a circuit device according to the second embodiment mode of the present invention. As described above, there is an advantage that the thermal shrinkage material is employed as the resin material of the insulating layer 9 of the shield pack 4.

As shown in FIGS. 7A to 7B, when the thermal shrinkage resin material is used for the shield pack 4, the entire portion of the printed circuit board 1 on which the electronic components have been mounted is inserted into the shield pack 4 having the sack shape. Subsequently, as shown in FIG. 7C, the shield pack 4 is heated by a heating air supplier 14, a reflow furnace, or the like, so that this shield pack 4 is thermally shrunken. Thus, the shield pack 4 is made closely contact the printed circuit board 1.

In the first and second embodiments, the ground connection terminal 5 is planted on the printed circuit board 1. However, a hole may be formed in the printed circuit board 1, and the printed circuit board 1 may be shielded by the shield pack 4, and thereafter, a pin or a screw may be inserted into the hole of the printed circuit board 1. In the third embodiment of the present invention, the ground connection terminal 5 is not provided on the printed circuit board 1. An electromagnetic shielding method carried out at this time will now be explained with reference to FIGS. 8A to 8E.

Figure 8A:
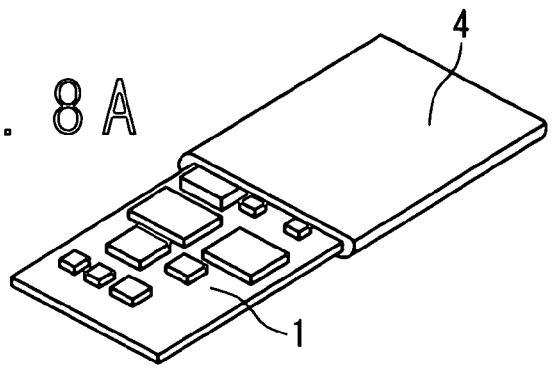
FIGS. 8A to 8E are diagrams showing the shielding method of the circuit device according to a third embodiment mode of the present invention.
Figure 8B:
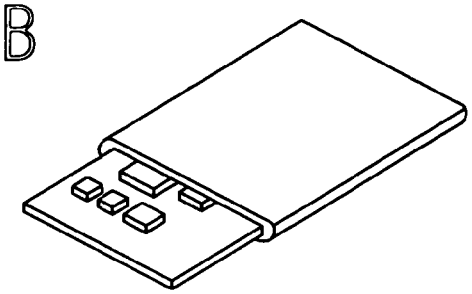
Figure 8C:
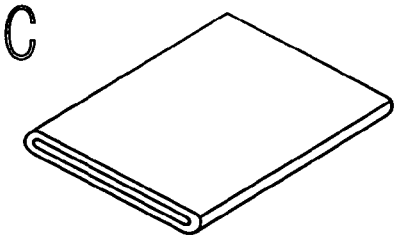
Figure 8D:
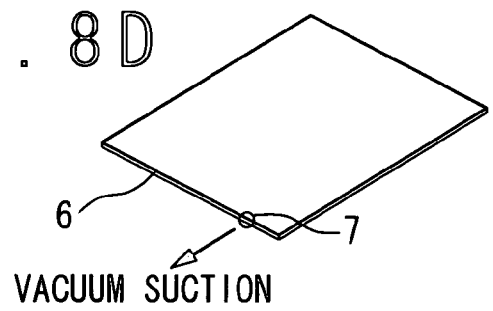
Figure 8E:
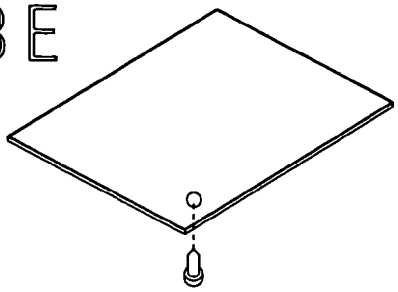
Figure 9:
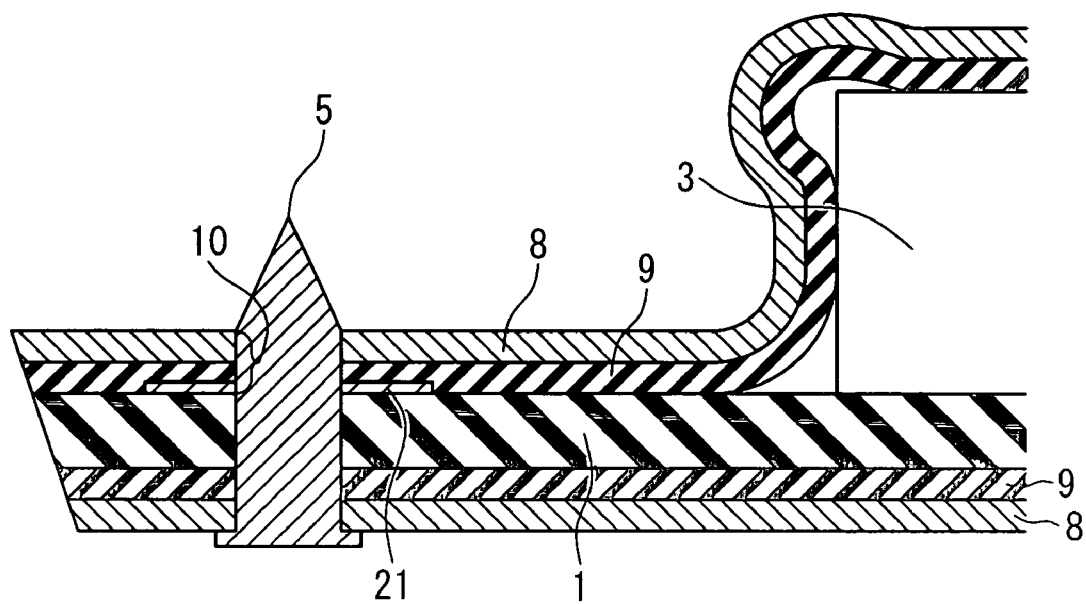
FIG. 9 is a diagram showing a state that a connection component have been mounted.

As shown in FIGS. 8A to 8C, the entire of the printed circuit board 1 on which the electronic components have been mounted is inserted into the shield back 4 having the sack shape. Subsequently, as shown in FIG. 8D, a joint portion 6 of a major portion of an opening portion of the shield pack 4 is fit with each other, and vacuum suction is carried out from a remaining opening portion 7 of the of the shield pack 4. As a result, an inner capacity of the shield pack 4 is reduced, and the shield pack 4 is made closely contact to the surface of the printed circuit board 1 and the surface of the mount components. Subsequently, as shown in FIG. 8E, an electric conductive connection component such as a via or a pin is mounted in such a manner that this electric conductive connection component passes through a ground connection portion 21 of the printed circuit board 1 and the shield pack 4. This passing state is shown in FIG. 9. As a consequence, the metal layer 8 of the shield pack 4 can be electrically connected to a ground pattern of the printed circuit board 1. In this case, the projection as the ground connection terminal needs not be provided on the board. Therefore, the safe handling characteristic of the printed circuit board 1 can be increased, and an increase in cost can be suppressed.

Figure 10:
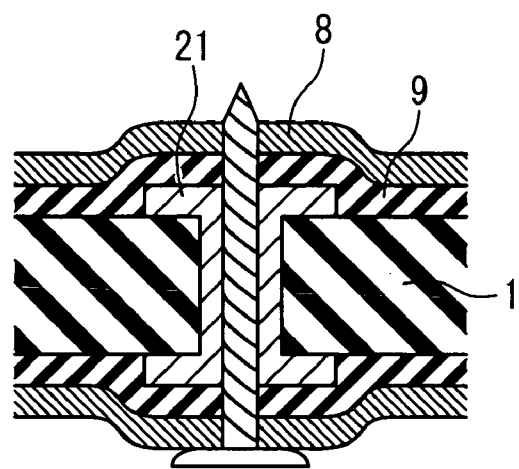
FIG. 10 is a diagram showing a state that the connection component has been mounted when a through-hole of a printed circuit board is filled with an electric conductor.

At this time, as shown in FIG. 10, it is desirable that a through-hole is previously formed in the printed circuit board 1, and an inter portion of this through-hole is filled with an electric conductor connected to the ground connection portion. The above-described example has exemplified such a case that the insulating layer of the shield pack is made of the thermosetting resin. As described in the second embodiment, a similar effect can be achieved when the insulating layer is made of the thermal shrinkage resin.

It could be understood that the connection component such as the screw and the pin occupies the area of the printed circuit board 1. If the connection component is commonly used as a fixing screw for fixing the printed circuit board la to a housing (not shown), the occupied area can be suppressed as small as possible.

Also, another method may be effectively employed in which an adhesive agent (not shown) is coated on at least an area of the surface of the printed circuit board 1 and a portion of the surface of each mount component, and the entire portion is vacuum-sucked. In this case, although the area used to coat the adhesive agent is required and the repair characteristic is deteriorated, low cost may be realized.

It would be apparent to a person in the art that the present invention is not limited only to the above-described various embodiments, but the respective embodiments may be properly changed within the technical scope of the present invention. Also, the total number of the above-mentioned structural members, the positions thereof, and the shapes thereof are not limited only to those of the above-described embodiments, and may be set to the numbers, positions, and shapes, which are suitable for carrying out the present invention. It should be noted that in the respective drawings, the same reference numerals are allocated to the same structural elements.

In the circuit device and the shielding method of the circuit device according to the present invention, the effective electromagnetic shield can be achieved by merely contacting the shield pack having the insulating layer and the metal layer with the printed circuit board on which the electronic components have been mounted. As a consequence, the electromagnetic shield can be achieved in the minimum space in the simple and firm manner without hindering the high density mounting of the electronic components. Also, the printed circuit board can be reinforced at the same times as the shield pack in close contact to the printed circuit board is hardened.

In addition, in accordance with the circuit device and the shielding method of the circuit device of the present invention, the shield pack can be simply dismounted even when a certain problem occurs in the printed circuit board after the electromagnetic shield has been accomplished, and/or even when the entire or portion of the printed circuit board is wanted to be exposed in order to check and repair the electronic components. Also, there is such an effect that this feature can avoid mischief since the shield pack 4 which has been once dismounted cannot be again mounted.

The invention claimed is:

1. A method of shielding a circuit device, comprising:
   (a) providing a circuit board on which an electronic component has been mounted and which has a ground connection portion;
   (b) inserting an entire portion of said circuit board into a shield pack having a sack shape, said shield pack having an insulating layer as an innermost layer and an electric conductive layer as an outermost layer; and
   (c) contacting said insulating layer of said shield pack with said electronic component and said circuit board, wherein said ground connection portion of said circuit board is connected to said electric conductive layer of said shield pack, wherein a ground connection terminal is connected to the ground connection portion, the ground connection terminal including a tip portion and a base portion, the tip portion being inserted through the shield pack, wherein a bottom area of the tip portion is disposed on a surface of the outermost layer and the base portion is disposed within at least the outermost layer, and wherein a sectional area of the base portion is smaller than the bottom area of the tip portion.

2. The shielding method of a circuit device according to claim 1, wherein said (c) contacting step comprises:
(d) reducing an internal capacity of said shield pack.

3. The shielding method of a circuit device according to claim 2, wherein
said ground connection terminal breaks through said shield pack to be connected with said electric conducive layer during said (c) contacting step.

4. The shielding method of a circuit device according to claim 3, wherein said ground connection terminal comprises:
the tip portion having a conical shape; and
the base portion connected to said tip portion, wherein said base portion has a sectional area which is smaller than a bottom plane of said conical shape such that said base portion does not project from the bottom plane of said conical shape.

5. The shielding method of a circuit device according to claim 4, wherein said base portion of said ground connection terminal has a height which is substantially equal to a thickness of said shield pack, and
when said tip portion breaks through said shield pack, the bottom plane of said conical shape is connected to said electric conductive layer.

6. The shielding method of a circuit device according to claim 3,
wherein said (d) reducing step comprises:
vacuum-sucking air contained in said shield pack such that said insulating layer of said shield pack contacts said electronic component and said circuit board.

7. The shielding method of a circuit device according to claim 3, wherein an adhesive agent is coated on at least a portion of said circuit board and at least a portion of an outer surface of said electronic component, and
said (d) reducing step comprises:
vacuum-sucking air contained in said shield pack such that said insulating layer of said shield pack contacts said electronic component and said circuit board.

8. The shielding method of a circuit device according to claim 3, wherein said shield pack is made of thermal shrinkage material, and
said (d) reducing step comprises:
heating said shield pack such that said insulating layer of said shield pack contacts said electronic component and said circuit board.

9. The shielding method of a circuit device according to claim 3, wherein an adhesive agent is coated on at least a portion of said circuit board and at least a portion of an outer surface of said electronic component,
said shield pack is made of thermal shrinkage material, and
said (d) reducing step comprises:
heating said shield pack such that said insulating layer of said shield pack contacts said electronic component and said circuit board.

10. The shielding method of a circuit device according to claim 2, further comprising:
connecting said ground connection portion and said electric conductive layer by passing an electric conductive connection component through said ground connection portion between said shield pack and said circuit board, after said insulating layer of said shield pack is fit with said electronic component and said circuit board.

11. The shielding method of a circuit device according to claim 10, wherein said circuit board has a through-hole formed in said ground connection portion,
said through-hole is filled with an electric conductor connected to said ground connection portion, and
said connection component passes through said through-hole to connect said ground connection portion with said electric conductive layer.

12. The shielding method of a circuit device according to claim 10, wherein said connection component is used to fix said circuit board contained within said shield pack to a housing, and
said housing has an electric conductive portion connected to said electric conductive layer.

13. An electromagnetically shielded circuit devices comprising:
a circuit board on which an electronic component has been mounted and which has a ground connection portion;
a sack-shaped shield pack which covers an entire portion of said circuit board, said shield pack having an insulating layer as an innermost layer and an electric conductive layer as an outermost layer; and
an electric conductive connection component which passes through said shield pack to said circuit board to connect said ground connection portion to said electric conductive layer of said shield pack, wherein said electric conductive connection component includes a tip portion and a base portion, the tip portion being insertable through the shield pack, wherein a bottom area of the tip portion is disposed on a surface of the outermost layer and the base portion is disposed within at least the outermost layer, and wherein a sectional area of said base portion is smaller than the bottom area of the tip portion.

14. The electromagnetically shielded circuit device according to claim 13, wherein said connection component is a ground connection terminal which is previously fixedly provided to said ground connection portion of said circuit board.

15. The electromagnetically shielded circuit device according to claim 14, wherein said ground connection terminal includes the tip portion having a conical shape and the base portion connected to said tip portion, and
said base portion has a sectional area which is smaller than a bottom plane of said conical shape such that said base portion does not project from the bottom plane of said conical shape.

16. The electromagnetically shielded circuit device according to claim 15, wherein said base portion of said ground connection terminal has a height which is substantially equal to a thickness of said shield pack, and
the bottom plane of said conical shape is connected to said electric conductive layer under in a state that said tip portion breaks through said shield pack.

17. The electromagnetically shielded circuit device according to claim 13, wherein said circuit board has a through-hole formed in said ground connection portion,
said through-hole is filled with an electric conductor connected to said ground connection portion, and
said connection component passes through said through-hole to connect said ground connection portion with said electric conductive layer.

18. The electromagnetically shielded circuit device according to claim 13, wherein said connection component is a via, and is used to fix said circuit board contained within said shield pack to a housing, and said housing has an electric conductive portion connected to said electric conductive layer.

19. A method of shielding a circuit device, comprising:
providing a circuit board on which an electronic component is mounted and which has a ground connection portion;
inserting a portion of said circuit board into a shield pack, said shield pack having an insulating layer as an innermost layer and an electric conductive layer as an outermost layer; and
contacting said insulating layer of said shield pack with said electronic component and said circuit board,
wherein said ground connection portion of said circuit board is connected to said electric conductive layer of said shield pack, and a ground connection terminal is connected to the ground connection Portion, said ground connection terminal including:
a tip portion having a conical shape; and
a base portion connected to said tip portion, wherein said base portion has a sectional area which is smaller than a bottom area of said conical shape such that said base portion does not project from the bottom area of said conical shape.

20. An electromagnetically shielded circuit device comprising:
a circuit board on which an electronic component is mounted and which has a ground connection portion;
a shield pack which covers a portion of said circuit board, said shield pack having an insulating layer as an innermost layer and an electric conductive layer as an outermost layer; and
an electric conductive connection component which passes through said shield pack to said circuit board to connect said ground connection portion to said electric conductive layer of said shield pack,
wherein a ground connection terminal is connected to said ground connection portion, said ground connection terminal including:
a tip portion having a conical shape; and
a base portion connected to said tip portion, said base portion having a sectional area which is smaller than a bottom area of said conical shape such that said base portion does not project from the bottom area of said conical shape.

* * * * *